(12) United States Patent
Luo et al.

(10) Patent No.: US 12,745,378 B2
(45) Date of Patent: Sep. 22, 2026

(54) OPTICAL TRANSCEIVER MODULE WITH EMI SHIELDING

(71) Applicant: Global Technology Inc., Ningbo (CN)

(72) Inventors: Jian-hong Luo, Ningbo (CN); Di Wang, Ningbo (CN); YiMeng Xu, Ningbo (CN)

(73) Assignee: Global Technology Inc., Ningbo (CN)

( * ) Notice: Subject to any disclaimer, the term of this patent is extended or adjusted under 35 U.S.C. 154(b) by 260 days.

(21) Appl. No.: 18/781,719

(22) Filed: Jul. 23, 2024

(65) Prior Publication Data

US 2025/0351315 A1 Nov. 13, 2025

(30) Foreign Application Priority Data

May 8, 2024 (CN) ......................... 202410567717.8

(51) Int. Cl.
*H05K 9/00* (2006.01)
*G02F 1/03* (2006.01)

(52) U.S. Cl.
CPC ............. *H05K 9/0022* (2013.01); *G02F 1/03* (2013.01); *H05K 9/0058* (2013.01); *G02F 2202/20* (2013.01)

(58) Field of Classification Search
None
See application file for complete search history.

(56) References Cited

U.S. PATENT DOCUMENTS

2001/0030789 A1* 10/2001 Jiang ...................... G02B 6/428 398/139
2014/0341570 A1* 11/2014 Sindhu ................ H04B 10/032 398/49

* cited by examiner

*Primary Examiner* — David W Lambert
(74) *Attorney, Agent, or Firm* — Secant IP, P.L.L.C.

(57) ABSTRACT

The present disclosure provides an optical module, including a housing, an optical transmitter assembly, an optical receiver assembly, and an EMI shielding. The optical transmitter assembly is accommodated in the housing. The optical transmitter assembly includes an optical transmitting unit and an optical modulator, and the optical modulator is optically coupled to the optical transmitting unit. The optical receiver assembly is accommodated in the housing. The EMI shielding is accommodated in the housing, and the optical transmitter assembly and the optical receiver assembly are located on opposite sides of the EMI shielding, respectively.

17 Claims, 7 Drawing Sheets

OPTICAL TRANSCEIVER MODULE WITH EMI SHIELDING

CROSS-REFERENCE TO RELATED APPLICATIONS

This non-provisional application claims priority under 35 U.S.C. § 119 (a) on Patent Application No(s). 202410567717.8 filed in China on May 8, 2024, the entire contents of which are hereby incorporated by reference.

BACKGROUND

Technical Field

The present disclosure relates to an optical module, particularly to a tunable optical transceiver module including electromagnetic interference (EMI) shielding.

Related Art

With respect to modern high-speed communication network, optical modules are generally installed in an electronic communication apparatus for various applications including, but not limited to, internetwork data center, Cable TV broadband, and fiber to the home (FTTH). With the improvement of the performance of the electronic communication apparatus and the increase in demand for communication bandwidth for various network services, the existing optical modules still present some problems, such as small internal accommodation space and high power consumption, to be solved.

Therefore, how to provide optical modules with small size, an internal space having better space utilization and low power consumption while increasing bandwidth and transmission rate is one of the most challenging topics in this technical field.

SUMMARY

According to one embodiment of the present disclosure, an optical module includes a housing, an optical transmitter assembly, an optical receiver assembly, and an EMI shielding. The optical transmitter assembly is accommodated in the housing. The optical transmitter assembly includes an optical transmitting unit and an optical modulator, and the optical modulator is optically coupled to the optical transmitting unit. The optical receiver assembly is accommodated in the housing. The EMI shielding is accommodated in the housing, and the optical transmitter assembly and the optical receiver assembly are located on opposite sides of the EMI shielding, respectively.

According to another embodiment of the present disclosure, an optical module includes a housing, an optical transmitter assembly, an optical receiver assembly, and an EMI shielding. The optical transmitter assembly and the optical receiver assembly are accommodated in the housing. The optical receiver assembly includes an optical receiving unit, a first optical path folding element, and a second optical path folding element. The EMI shielding is accommodated in the housing, and the optical transmitter assembly and the optical receiver assembly are located on opposite sides of the EMI shielding, respectively. The optical receiving unit has a top light-receiving surface, the first optical path folding element has a first reflective surface and a second reflective surface, and the second optical path folding element has a third reflective surface. An external optical signal entering the first optical path folding element along a first optical axis is folded by the first reflective surface and propagated to the second reflective surface along a second optical axis. The external optical signal is folded at the second reflective surface and propagated to the second optical path folding element along a third optical axis. The external optical signal is folded at third reflective surface and propagated to the top light-receiving surface along a fourth optical axis.

BRIEF DESCRIPTION OF THE DRAWINGS

The present disclosure will become better understood from the detailed description given hereinbelow and the accompanying drawings which are given by way of illustration only and thus are not intended to limit the present disclosure and wherein.

DETAILED DESCRIPTION

Figure 1:
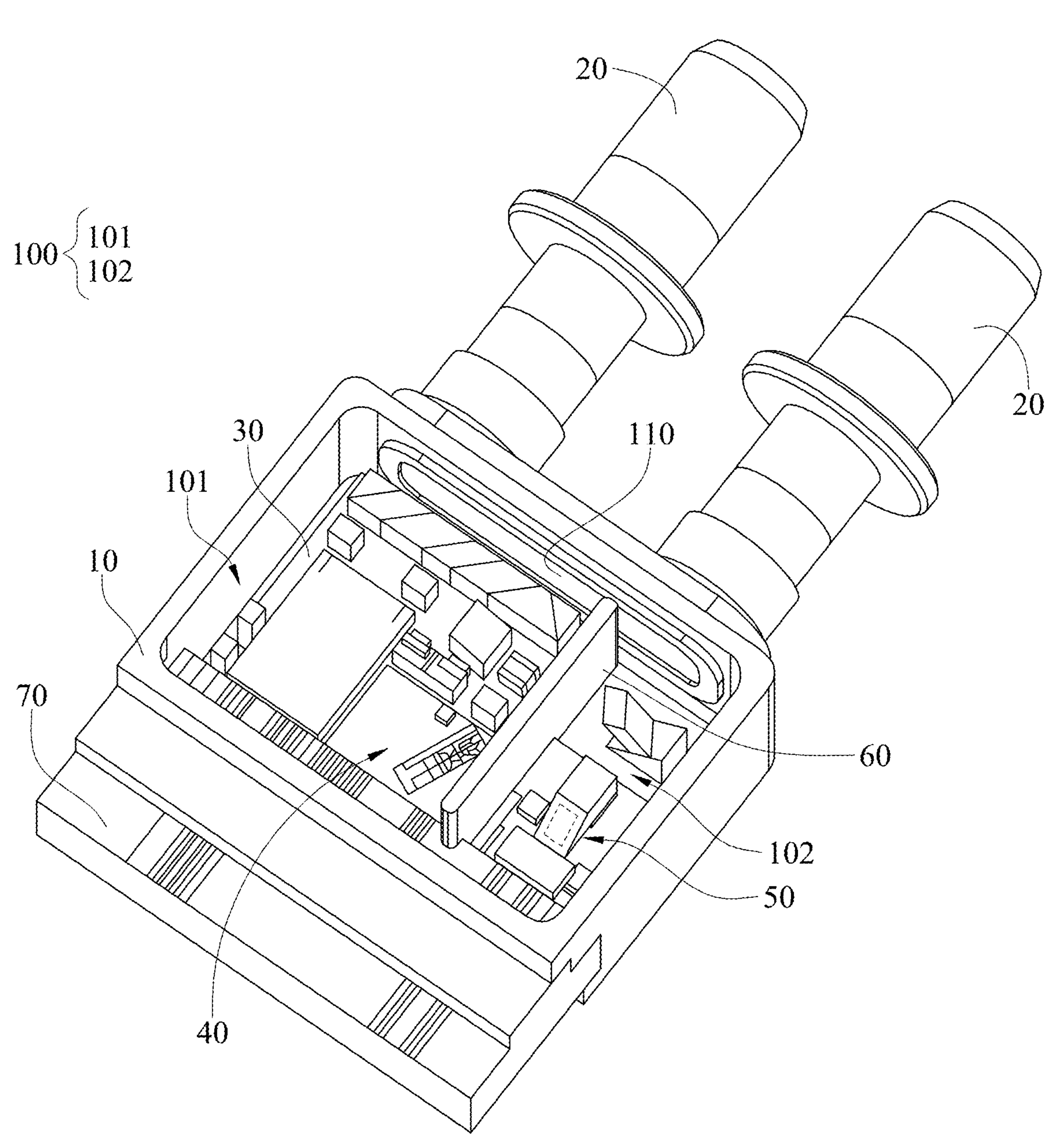
FIG. 1 is a perspective view of an optical module according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

In compliance with the form factor, with the increasing demands for optical modules that are small and have a large number of channels, one of the current problems found by inventors is to provide optical modules that can be configured with more active components or passive components associated with optical communication. Inventors found that a configuration encapsulating an optical transmitter assembly and an optical receiver assembly within a single housing draws significant attention. However, due to the trend of the compactness of an optical module, the crosstalk between active components has become more serious. For example, there may be a significant crosstalk between conductive traces for electrically coupling a laser diode driver to a laser diode and conductive traces for electrically coupling a photodiode to a transimpedance amplifier. Besides, in a dense wavelength division multiplexing (DWDM) system, the use of multiple optical modules having constant wavelength leads to the rising costs of storage and management for users.

According to one embodiment of the present disclosure, an EMI shielding may inhibit the radiated noise generated by the high-frequency signals transmitted through the conductive traces. Since the optical transmitter assembly and the optical receiver assembly are located on opposite sides of the EMI shielding, respectively, the EMI shielding is allowed to reduce the crosstalk occurred between the conductive traces of the optical transmitter assembly and the conductive traces of the optical receiver assembly.

According to one embodiment of the present disclosure, a tunable optical transmitting unit may emit optical carriers having different wavelengths. The tunable optical transmitting unit may dynamically adjust the working wavelength of the optical transmitting unit by working with a monitoring photodiode and an etalon, thereby realizing stable output of the target wavelength, while reducing the costs of storage and management.

According to one embodiment of the present disclosure, in order to prevent a signal transmission path between an electrical feedthrough and an optical receiving base of the optical receiver assembly from being too long, a signal input plane of the optical modulator and a signal output plane of the electronic component may be substantially aligned with a signal transmission plane of the electrical feedthrough. However, such configuration may result in a configuration in which an altitude of the optical receiving unit is higher than an altitude of the optical coupler. Therefore, one or more additional optical path folding elements are required. The aforesaid altitude difference may be compensated by adding an optical path folding element, such as a rhombic prism.

Some or all of the technical features disclosed in one or more embodiments of the present disclosure may be combined to achieve corresponding effects.

The term “couple” or “coupled to” refers to any connection, link, or the like. Moreover, the term “optically couple” or “optically coupled to” refers to a relationship where light is transmitted (imparted) from a device to another. Unless otherwise specified, devices that “couple” or “coupled to” each other do not need to be directly connected to each other and may be separated by intervening objects.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic.

Figure 2:
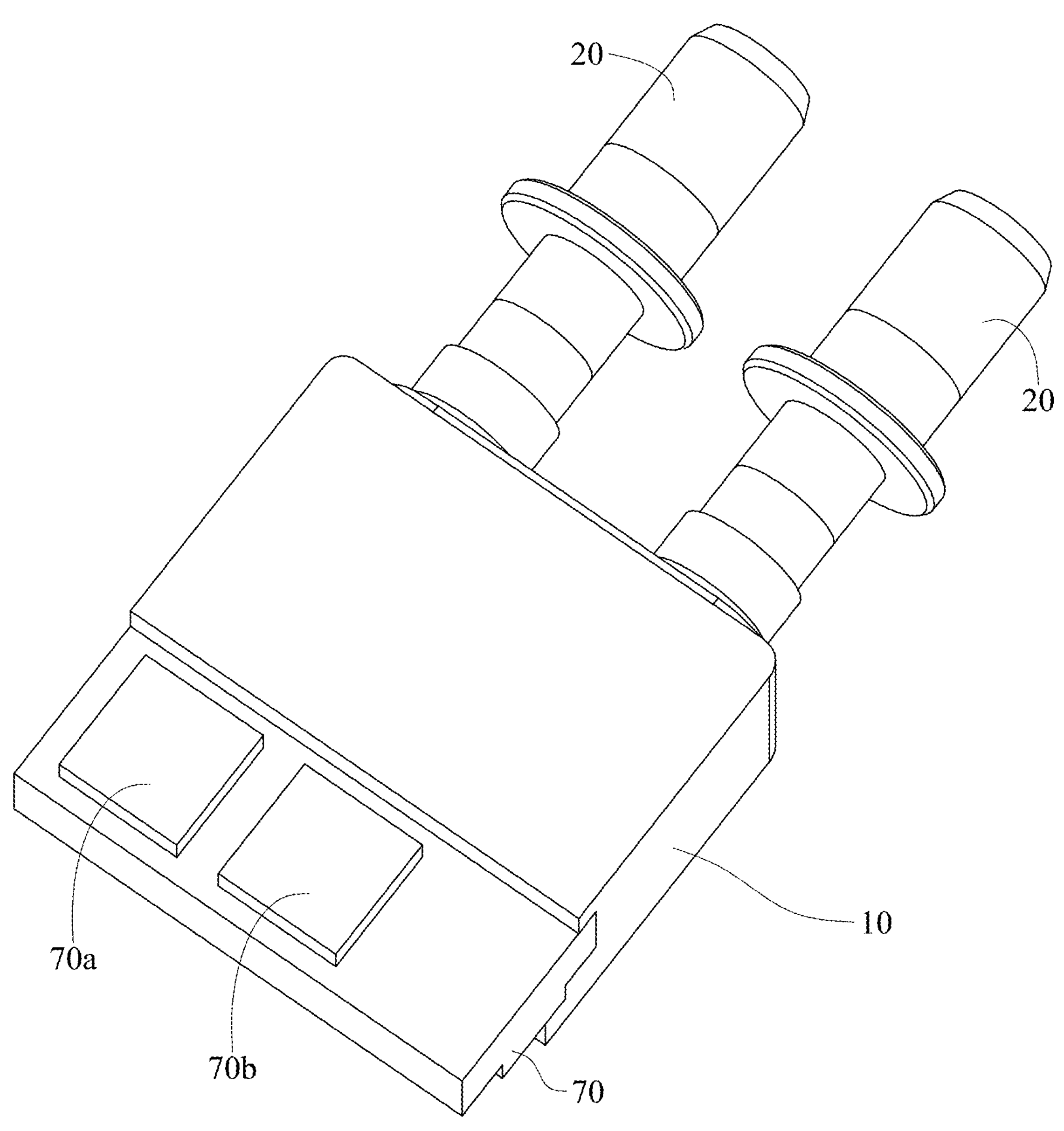
FIG. 2 is another perspective view of the optical module in FIG. 1.
Figure 3:
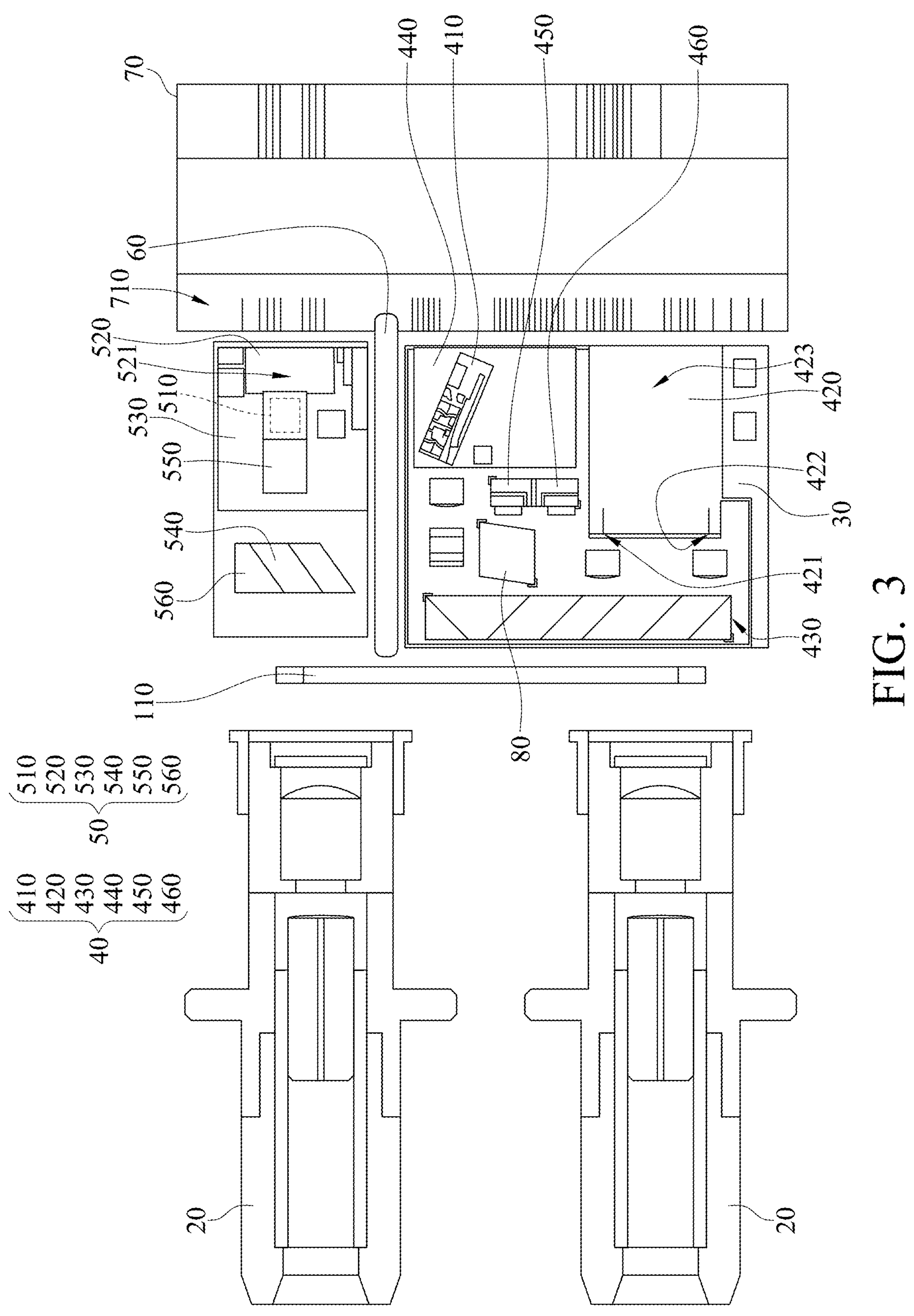
FIG. 3 is a schematic view of components of the optical module in FIG. 1.

Please refer to FIGS. 1 to 3. FIG. 1 is a perspective view of an optical module 1 according to one embodiment of the present disclosure, FIG. 2 is another perspective view of the optical module 1 in FIG. 1, and FIG. 3 is a schematic view of components of the optical module 1 in FIG. 1. In this embodiment, the optical module 1 may include a housing 10, multiple optical couplers 20, a base 30, an optical transmitter assembly 40, an optical receiver assembly 50, and an EMI shielding 60. For the illustration, a top of the housing 10 is omitted in FIG. 1.

The housing 10 may be a housing made of metal. The housing 10 may be understood as a hermetic housing or a non-hermetic housing configured to encapsulate laser diodes. The optical coupler 20 may be disposed within an accommodation space defined by the housing 10. Further, at least a part of the optical coupler 20 may extend out of the accommodation space. Each optical coupler 20 may be understood as an optical fiber connector or a fiber connector receptacle, and an optical fiber (not shown) may be inserted in the optical coupler 20 to be optically coupled to the optical transmitter assembly 40 or the optical receiver assembly 50. FIGS. 1 and 2 exemplarily illustrate that the optical module 1 is a dual-fiber bidirectional optical transceiver and includes two optical couplers 20, but the present disclosure is not limited thereto.

The base 30, such as a printed circuit board assembly (PCBA) or a thermoelectric cooler, may be accommodated in the housing 10. FIG. 1 exemplarily illustrates that the base 30 is a thermoelectric cooler having a cold end and a hot end. The thermoelectric cooler may be understood as a cooling module, and each of the cold end and the hot end may be understood as a ceramic sheet with appropriate thermal conductivity. The optical transmitter assembly 40 may be disposed at the cold end of the base 30 (thermoelectric cooler).

The optical transmitter assembly 40 may be accommodated in the housing 10. Further, the optical transmitter assembly 40 may include an optical transmitting unit 410 and an optical modulator 420 disposed on the base 30. As shown in FIG. 3, the optical modulator 420 may have an optical receiving port 421 and an optical transmitting port 422 located on the same side thereof. The optical receiving port 421 may be optically coupled to the optical transmitting unit 410, and the optical transmitting port 422 may be optically coupled to one of the optical couplers 20. Further, the optical transmitter assembly 40 may further include an optical path folding element 430. The optical path folding element 430 may be configured to fold an optical axis of the optical transmitting unit 410, so that the optical transmitting unit 410 is optically coupled to the optical receiving port 421. The optical path folding element 430 may further be configured to fold an optical axis of the optical modulator 420, so that the optical transmitting port 422 is optically coupled to the said optical fiber interposed in the optical coupler 20. Besides, the optical transmitter assembly 40 may further include, but not limited to, a collimating lens and an optical isolator that may be disposed on the base 30. The optical transmitting unit 410 may be understood as a laser diode. More specifically, the optical transmitting unit 410 may be a wavelength-tunable laser diode or a continuous wave laser (CW Laser). The optical modulator 420 may be understood as a Mach-Zehnder modulator or a thin-film lithium niobate modulator, which is allowed to provide the optical transmitter assembly 40 having high bandwidth and high signal transmission rate. The optical path folding element 430 may be understood as an assembly configured by a plurality of prisms, an assembly configured by a plurality of reflection lenses, or an assembly configured by one or more prism(s) and one or more reflection lens(es).

The optical receiver assembly 50 may be accommodated in the housing 10. Further, the optical receiver assembly 50 may include an optical receiving unit 510 and an electronic component 520. The optical receiving unit 510 may be, for example, a photodiode, and the electronic component 520 may be, for example, a transimpedance amplifier (TIA). As shown in FIG. 3, the optical receiving unit 510 may be electrically coupled to the electronic component 520. More specifically, the optical receiving unit 510 may be an avalanche photodiode (APD).

In some embodiments, the optical transmitter assembly 40 may be understood as a transmitting optical sub-assembly (TOSA) module. In some embodiments, the optical receiver assembly 50 may be understood as a receiver optical sub-assembly (ROSA) module.

The EMI shielding 60 may be accommodated in the housing 10, and the optical transmitter assembly 40 and the optical receiver assembly 50 may be located on opposite sides of the EMI shielding 60, respectively. As shown in FIG. 1 and FIG. 3, the EMI shielding 60 may be a metal plate located between the optical transmitter assembly 40 and the optical receiver assembly 50. Further, the housing 10 may have a single hermetic chamber 100 which accommodates the optical transmitter assembly 40, the optical receiver assembly 50, and the EMI shielding 60. The wording "single (hermetic) chamber" used herein may refer that the hermetic chamber 100 has single accommodation space without multiple non-communicated cells defined by one or more partitions. The EMI shielding 60 may divide the hermetic chamber 100 into a left area 101 and a right area 102 which are communicated with each other and accommodate the optical transmitter assembly 40 and the optical receiver assembly 50, respectively. Further, there may be a gap between an optical window 110 of the housing 10 and the EMI shielding 60, such that the left area 101 may be communicated with the right area 102 via the said gap.

According to one embodiment of the present disclosure, the optical module 1 may further include an electrical feedthrough 70 disposed on the housing 10. As shown in FIGS. 1 and 2, a part of the electrical feedthrough 70 may extend out of the housing 10, and another part thereof may extend into the housing 10. The optical transmitting unit 410 and the optical modulator 420 of the optical transmitter assembly 40 may be electrically coupled to the electrical feedthrough 70. Further, please additionally refer to FIG. 3, the optical transmitter assembly 40 may include an optical transmitting base 440 supporting the optical transmitting unit 410, and the optical receiver assembly 50 may include an optical receiving base 530 supporting the optical receiving unit 510 and the electronic component 520 (e.g., transimpedance amplifier). The optical transmitting unit 410 may be electrically coupled to the electrical feedthrough 70 via the optical transmitting base 440, and may further be electrically coupled to a driving chip 70*b* via the electrical feedthrough 70. The electronic component 520 may be electrically coupled to the electrical feedthrough 70 directly, or may be electrically coupled to the electrical feedthrough 70 via the optical receiving base 530. The electronic component 520 may further be electrically coupled to a microprocessor 70*a* via the electrical feedthrough 70. Besides, there may be a gap between the EMI shielding 60 and the electrical feedthrough 70, such that the left area 101 may be communicated with the right area 102 via the said gap. The electrical feedthrough 70 may be understood as a ceramic circuit board or a flexible circuit board. Each of the optical transmitting base 440 and the optical receiving base 530 may be understood as a submount. Besides, both of the optical transmitting base 440 and the optical receiving base 530 may be wire bonded to the electrical feedthrough 70 through metal wires.

The EMI shielding 60 is able to inhibit the radiated noise generated by the high-frequency signals transmitted through the conductive traces. Since the optical transmitter assembly 40 and the optical receiver assembly 50 are located on opposite sides of the EMI shielding 60, respectively, the EMI shielding 60 is allowed to reduce the crosstalk occurred between the conductive traces of the optical transmitter assembly and the conductive traces of the optical receiver assembly.

According to one embodiment of the present disclosure, the optical transmitter assembly 40 may further include a monitoring photodiode (MPD). As shown in FIGS. 1 and 3, the optical transmitter assembly 40 may include a first monitoring photodiode 450 and a second monitoring photodiode 460 optically coupled to the optical transmitting unit 410. Further, in an optical coupling path between the optical transmitter assembly 40 and the first monitoring photodiode 450, an etalon 80 may be placed to cooperate with the wavelength-tunable optical transmitting unit 410. FIG. 3 exemplarily illustrates that the optical transmitter assembly 40 includes two monitoring photodiodes, but the number of the monitoring photodiodes is not intended to limit the present disclosure.

The etalon 80 may be a passive optical device, and there is an interference effect between two planes in the optical direction thereof to form a comb-shaped transmission peak, so that a monitoring value of the first photodiode 450 is related to the wavelength, while a monitoring value of the second photodiode 460 is not related to the wavelength. By adjusting a driving current of the optical transmitting unit 410 and a temperature of the thermoelectric cooler 30, the ratio of the monitoring values of the two photodiodes is kept stable to realize the control of the optical wavelength.

According to one embodiment of the present disclosure, a signal input plane of the optical modulator 420 and a signal output plane of the electronic component 520 may be substantially aligned with a signal transmission plane of the electrical feedthrough 70. As shown in FIGS. 1 and 3, the signal input plane of the optical modulator 420 may be substantially aligned with the signal output plane of the electronic component 520 (i.e., to be located at the same altitude). More specifically, the electrical feedthrough 70 may be configured so that the signal transmission plane thereof is substantially aligned with the signal input plane of the optical modulator 420 to shorten a length of the signal transmission path between the optical modulator 420 and the electrical feedthrough 70, e.g., to shorten a length of the metal wire. In this case, in order to prevent the signal transmission path between the optical modulator 420 and the electrical feedthrough 70 from being too long, the electronic component 520 is also configured so that the signal output plane thereof is substantially aligned with the signal transmission plane of the electrical feedthrough 70.

Here, the signal input plane of the optical modulator 420, the signal output plane of the electronic component 520, and the signal transmission plane of the electrical feedthrough 70 may refer to a surface or a reference plane where the electrical interconnect of these objects are located, respectively, or where the electrical terminals for metal wire welding are located. In this embodiment, the said signal input plane may refer to a top surface 423 of the optical modulator 420, the said signal output plane may refer to a top surface 521 of the electronic component 520, and the said signal transmission plane may refer to a top surface 710 of the electrical feedthrough 70.

Figure 4:
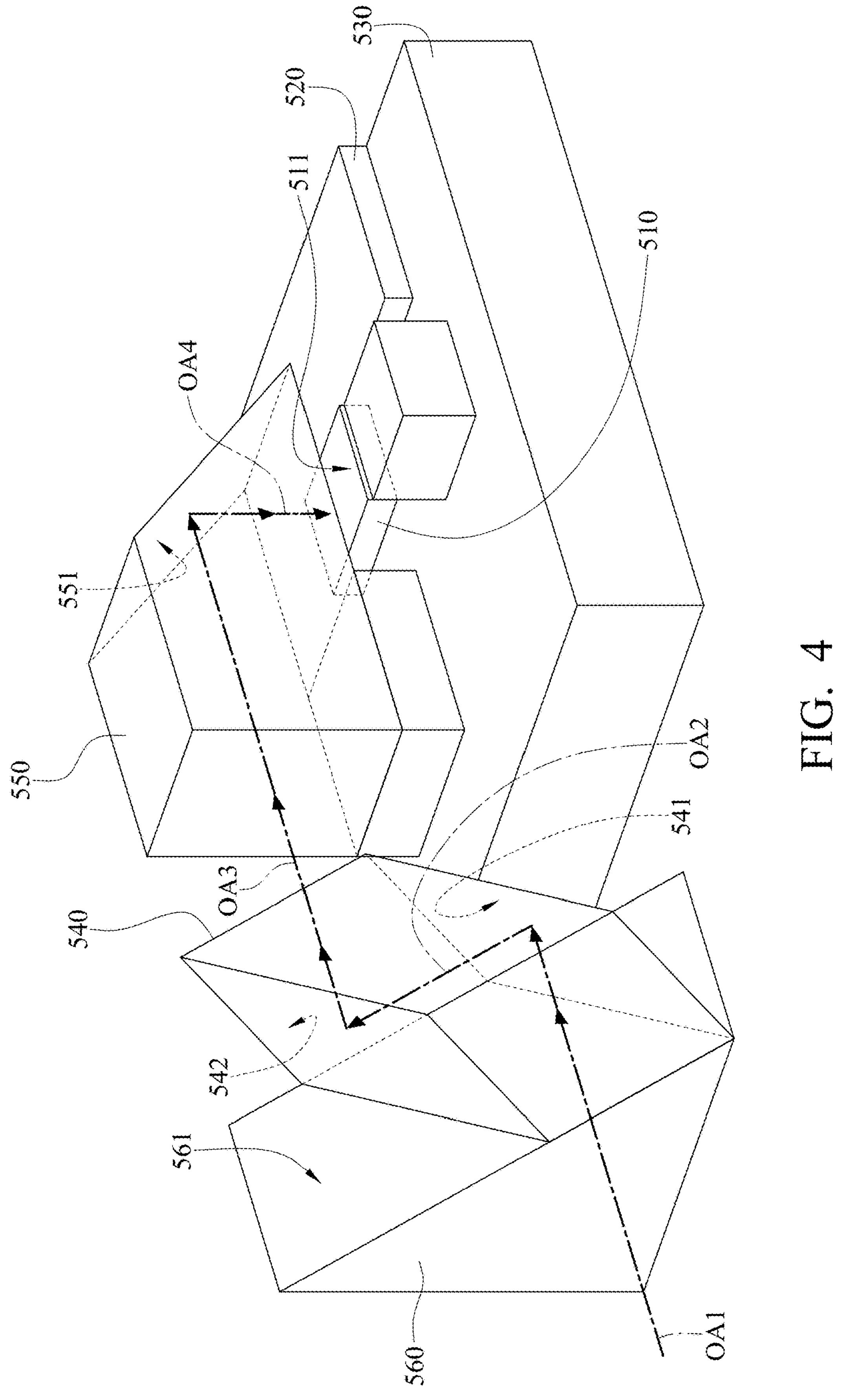
FIG. 4 is a schematic view of components of an optical receiver assembly of the optical module in FIG. 1.

However, such configuration may cause a problem in which an altitude of the optical receiving unit 510 is higher than that of the optical coupler 20, and thus additional optical path folding elements are required. According to one embodiment of the present disclosure, the optical receiver assembly 50 may further include an optical path folding element accommodated in the housing 10. Please additionally refer to FIG. 4. FIG. 4 is a schematic view of components of the optical receiver assembly 50 of the optical module 1 in FIG. 1. The optical receiver assembly 50 may include a first optical path folding element 540 and a second optical path folding element 550, and the optical receiving unit 510 may have a top light-receiving surface 511. The first optical path folding element 540 may have a first reflective surface 541 and a second reflective surface 542, and the second optical path folding element 550 may have a third reflective surface 551. External optical signals entering the optical module 1 through the optical coupler 20 and the optical window 110 may enter the first optical path folding element 540 along a first optical axis OA1.

According to one embodiment of the present disclosure, the optical receiver assembly 50 may further include a supporting base 560 accommodated in the housing 10. As shown in FIG. 4, the first optical path folding element 540 may be understood as a rhombic prism, and the second optical path folding element 550 may be understood as a combination of a trapezoid prism and a coupling lens. However, the optical path folding assembly is not limited to the prism and the coupling lens. The first optical path folding element 540 may be supported on an inclined surface 561 of the supporting base 560, and a second optical axis OA2 may be substantially perpendicular to a normal direction of the inclined surface 561.

Figure 5:
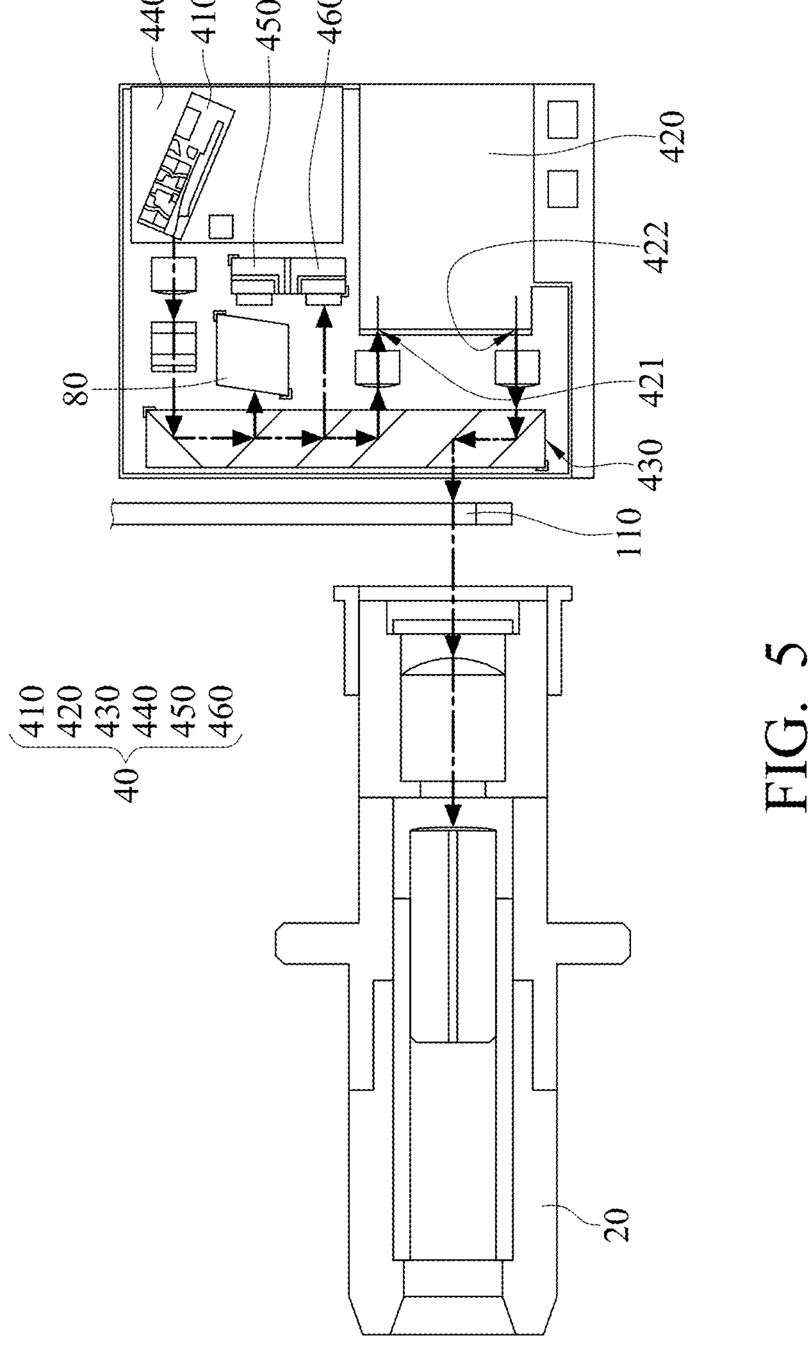
FIG. 5 is a schematic view showing an optical path of an optical transmitter assembly of the optical module in FIG. 1.

FIG. 5 is a schematic view showing an optical path of the optical transmitter assembly 40 of the optical module 1 in FIG. 1. The optical transmitting unit 410 of the optical transmitter assembly 40 may emit optical signals. The optical signals are emitted to the first monitoring photodiode 450 and the second monitoring photodiode 460 through the optical path folding element 430. The etalon 80 may be disposed between the optical path folding element 430 and the first monitoring photodiode 450. Therefore, a feedback optical path distributed in a three-dimensional manner may be provided to ensure the stable monitoring for the wavelength of the optical transmitting unit 410 while realizing the compact configuration of the feedback optical path. Besides, optical signals may be emitted to the optical receiving port 421 of the optical modulator 420 via the optical path folding element 430. The optical signals that have been modulated by the optical modulator 420 are emitted from the optical transmitting port 422 of the optical modulator 420, and then enter the optical coupler 20 through the optical path folding element 430 and the optical window 110 sequentially.

Figure 6:
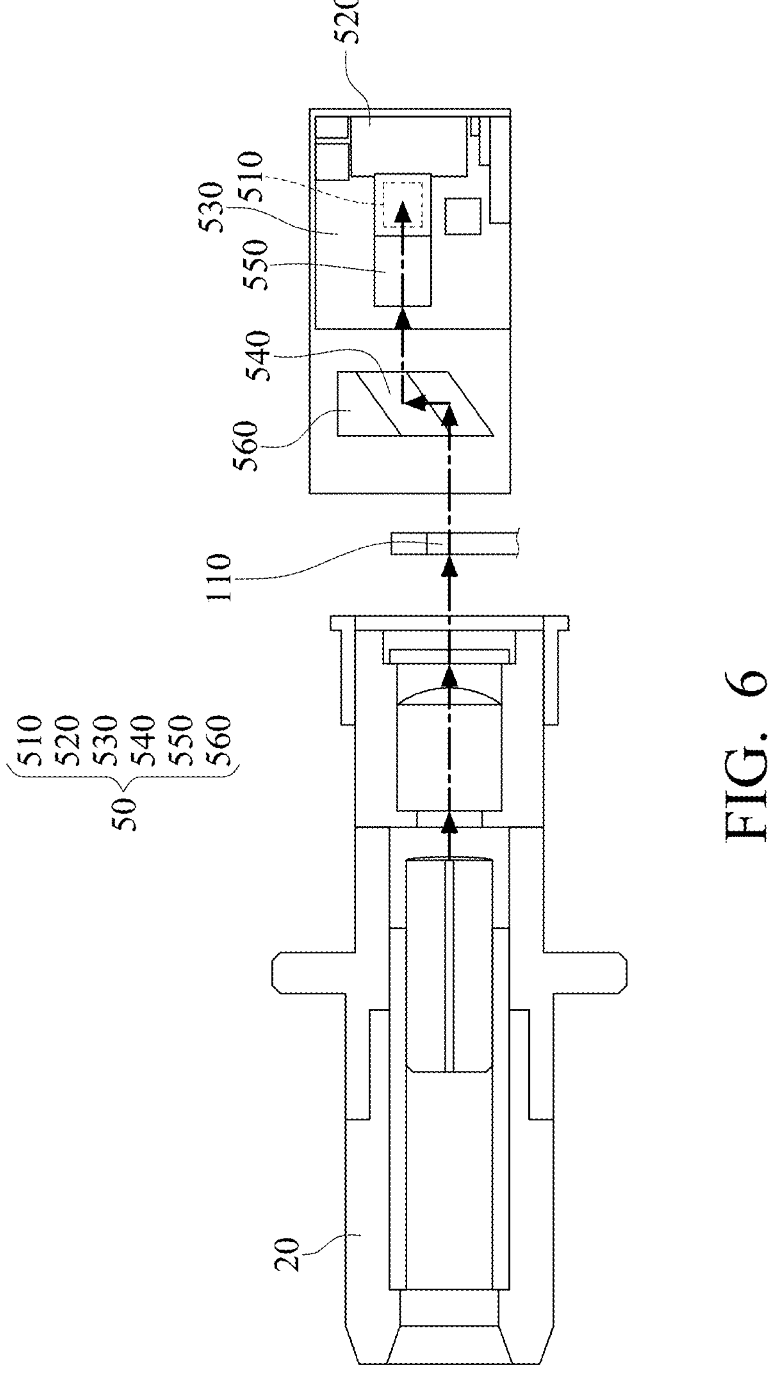
FIG. 6 is a schematic view showing an optical path of an optical receiver assembly of the optical module in FIG. 1.

FIG. 6 is a schematic view showing an optical path of the optical receiver assembly 50 of the optical module in FIG. 1. Please refer to FIGS. 4 and 6, the external optical signals may enter the first optical path folding element 540 from the optical coupler 20 through the optical window 110 and the first reflective surface 541. The optical signals are folded at the first reflective surface 541 and propagated to the second reflective surface 542 along the second optical axis OA2. Then, the external optical signals transmitted along the second optical axis OA2 may be folded at the second reflective surface 542 and propagated to the second optical path folding element 550 along a third optical axis OA3. Then, the external optical signals transmitted along the third optical axis OA3 may be folded at the third reflective surface 551 and propagated to the top light-receiving surface 511 along a fourth optical axis OA4.

Figure 7:
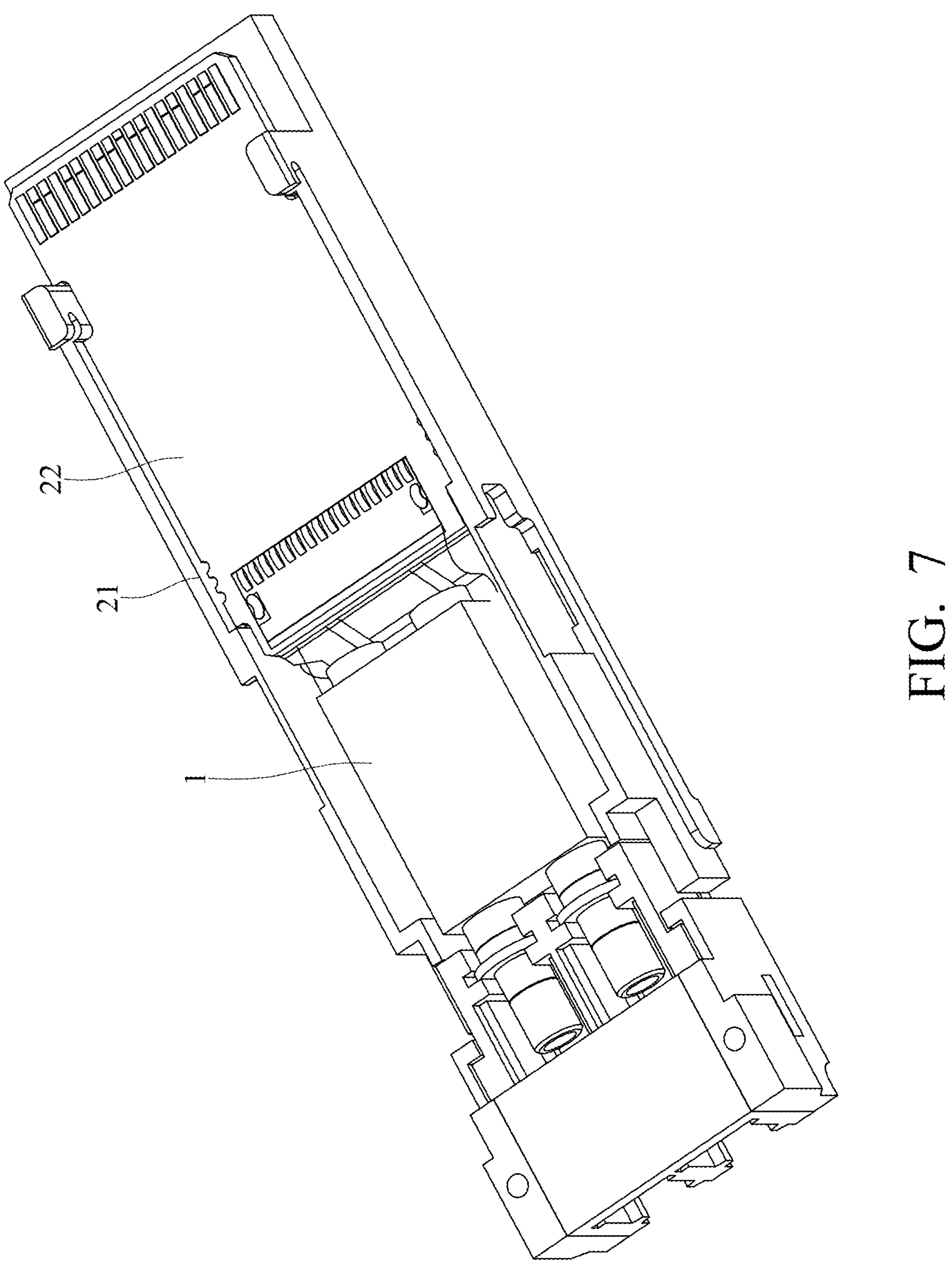
FIG. 7 is a schematic view showing that an optical module according to one embodiment of the present disclosure is applied to an optical transceiver.

FIG. 7 is a schematic view showing that the optical module 1 according to one embodiment of the present disclosure is applied to an optical transceiver 2. The optical transceiver 2 may include the optical module 1 as shown in FIG. 1, and may further include an outer housing 21 and a printed circuit board assembly 22. For the illustration, an upper half part of the outer housing 21 is omitted in FIG. 7. The optical module 1 may be accommodated in the outer housing 21, and the optical module 1 may be supported on an upper surface of the printed circuit board assembly 22 or be electrically coupled to the printed circuit board assembly 22.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An optical module, comprising:

a housing;

an optical transmitter assembly, accommodated in the housing, wherein the optical transmitter assembly comprises an optical transmitting unit and an optical modulator, and the optical modulator is optically coupled to the optical transmitting unit;

an optical receiver assembly, accommodated in the housing; and an electromagnetic interference (EMI) shielding, accommodated in the housing, wherein the optical transmitter assembly and the optical receiver assembly are located on opposite sides of the EMI shielding, respectively.

2. The optical module according to claim 1, wherein the housing has a hermetic chamber accommodating the optical transmitter assembly, the optical receiver assembly, and the EMI shielding, the hermetic chamber is a single chamber, and the EMI shielding divides the hermetic chamber into two areas that are communicated with each other and accommodate the optical transmitter assembly and the optical receiver assembly, respectively.

3. The optical module according to claim 1, wherein the optical transmitting unit is a wavelength-tunable laser diode, and the optical modulator is a thin-film lithium niobate modulator.

4. The optical module according to claim 1, wherein the optical transmitting unit is located closer to the EMI shielding than the optical modulator.

5. The optical module according to claim 1, wherein the optical transmitter assembly further comprises at least one monitoring photodiode (MPD), the at least one MPD is optically coupled to the optical transmitting unit, and the optical transmitting unit is located closer to the EMI shielding than the at least one MPD.

6. The optical module according to claim 1, further comprising an electrical feedthrough disposed on the housing, wherein the optical transmitter assembly further comprises an optical transmitting base supporting the optical transmitting unit, the optical receiver assembly comprises an optical receiving unit, a transimpedance amplifier, and an optical receiving base supporting the optical receiving unit and the transimpedance amplifier, a signal input plane of the optical modulator and a signal output plane of the transimpedance amplifier are substantially aligned with a signal transmission plane of the electrical feedthrough.

7. The optical module according to claim 6, wherein the optical receiving unit has a top light-receiving surface, the optical receiver assembly further comprises a first optical path folding element and a second optical path folding element accommodated in the housing, the first optical path folding element has a first reflective surface and a second reflective surface, and the second optical path folding element has a third reflective surface;

wherein, an external optical signal entering the first optical path folding element along a first optical axis is folded by the first reflective surface and propagated to the second reflective surface along a second optical axis, the external optical signal is folded at the second reflective surface and propagated to the second optical path folding element along a third optical axis, the external optical signal is folded at third reflective surface and propagated to the top light-receiving surface along a fourth optical axis.

8. The optical module according to claim 7, wherein the first optical path folding element is a rhombic prism.

9. The optical module according to claim 8, wherein the optical receiver assembly further comprises a supporting base accommodated in the housing, the first optical path folding element is supported on an inclined surface of the supporting base, and the second optical axis is substantially perpendicular to a normal direction of the inclined surface.

10. The optical module according to claim 1, further comprising two optical couplers disposed within the housing, wherein an optical transmitting port of the optical modulator is optically coupled to one of the two optical couplers, and the optical receiver assembly is optically coupled to another one of the two optical couplers.

11. The optical module according to claim 10, wherein the optical module is a dual-fiber bidirectional optical module.

12. An optical module, comprising:

a housing;

an optical transmitter assembly, accommodated in the housing;

an optical receiver assembly, accommodated in the housing, wherein the optical receiver assembly comprises an optical receiving unit, a first optical path folding element, and a second optical path folding element; and an EMI shielding, accommodated in the housing, wherein the optical transmitter assembly and the optical receiver assembly are located on opposite sides of the EMI shielding, respectively;

wherein, the optical receiving unit has a top light-receiving surface, the first optical path folding element has a first reflective surface and a second reflective surface, and the second optical path folding element has a third reflective surface;

wherein, an external optical signal entering the first optical path folding element along a first optical axis is folded by the first reflective surface and propagated to the second reflective surface along a second optical axis, the external optical signal is folded at the second reflective surface and propagated to the second optical path folding element along a third optical axis, the external optical signal is folded at third reflective surface and propagated to the top light-receiving surface along a fourth optical axis.

13. The optical module according to claim 12, wherein the first optical path folding element is a rhombic prism.

14. The optical module according to claim 13, wherein the optical receiver assembly further comprises a supporting base accommodated in the housing, the first optical path folding element is supported on an inclined surface of the supporting base, and the second optical axis is substantially perpendicular to a normal direction of the inclined surface.

15. The optical module according to claim 12, wherein the optical transmitter assembly comprises an optical transmitting unit and an optical modulator, and the optical transmitting unit is located closer to the EMI shielding than the optical modulator.

16. The optical module according to claim 15, wherein the optical transmitter assembly further comprises at least one MPD, the at least one MPD is optically coupled to the optical transmitting unit, and the optical transmitting unit is located closer to the EMI shielding than the at least one MPD.

17. The optical module according to claim 12, wherein the housing has a hermetic chamber accommodating the optical transmitter assembly, the optical receiver assembly, and the EMI shielding, the hermetic chamber is a single chamber, and the EMI shielding divides the hermetic chamber into two areas that are communicated with each other and accommodate the optical transmitter assembly and the optical receiver assembly, respectively.

* * * * *